United States Patent
Zope et al.

(10) Patent No.: US 10,163,656 B2
(45) Date of Patent: Dec. 25, 2018

(54) METHODS FOR DRY ETCHING COBALT METAL USING FLUORINE RADICALS

(71) Applicant: APPLIED MATERIALS, INC., Santa Clara, CA (US)

(72) Inventors: Bhushan N. Zope, Santa Clara, CA (US); Avgerinos V. Gelatos, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 369 days.

(21) Appl. No.: 14/520,989

(22) Filed: Oct. 22, 2014

(65) Prior Publication Data
US 2015/0140812 A1    May 21, 2015

Related U.S. Application Data

(60) Provisional application No. 61/905,195, filed on Nov. 16, 2013.

(51) Int. Cl.
| | |
|---|---|
| H01L 21/3213 | (2006.01) |
| H01L 29/66 | (2006.01) |
| H01L 21/321 | (2006.01) |
| H01J 37/32 | (2006.01) |
| C23F 4/00 | (2006.01) |
| H01L 21/768 | (2006.01) |
| H01L 23/532 | (2006.01) |

(52) U.S. Cl.
CPC .......... *H01L 21/32136* (2013.01); *C23F 4/00* (2013.01); *H01J 37/32082* (2013.01); *H01J 37/32357* (2013.01); *H01L 21/32115* (2013.01); *H01L 21/7684* (2013.01); *H01L 29/66545* (2013.01); *H01J 2237/334* (2013.01); *H01L 23/53257* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 6,465,362 B1 * | 10/2002 | Chae | ................ | H01L 21/32136 257/E21.2 |
| 6,872,322 B1 * | 3/2005 | Chow | ............... | H01J 37/32862 134/1.1 |
| 2004/0137749 A1 * | 7/2004 | Ying | ...................... | H01L 43/12 438/710 |
| 2005/0136185 A1 * | 6/2005 | Ramanathan | ........... | C23C 18/44 427/299 |
| 2008/0081483 A1 * | 4/2008 | Wu | .................... | H01J 37/32137 438/714 |
| 2014/0120635 A1 * | 5/2014 | Nishimura | .............. | H01L 43/12 438/3 |
| 2014/0326276 A1 * | 11/2014 | Wu | ...................... | C23C 16/4405 134/1.1 |

* cited by examiner

*Primary Examiner* — Abul Kalam
(74) *Attorney, Agent, or Firm* — Moser Taboada; Alan Taboada

(57) ABSTRACT

Embodiments of methods for etching cobalt metal using fluorine radicals are provided herein. In some embodiments, a method of etching a cobalt layer in a substrate processing chamber includes: forming a plasma from a process gas comprising a fluorine-containing gas; and exposing the cobalt layer to fluorine radicals from the plasma while maintaining the cobalt layer at a temperature of about 50 to about 500 degrees Celsius to etch the cobalt layer.

16 Claims, 3 Drawing Sheets

METHODS FOR DRY ETCHING COBALT METAL USING FLUORINE RADICALS

CROSS-REFERENCE TO RELATED APPLICATIONS

This application claims benefit of U.S. provisional patent application Ser. No. 61/905,195, filed Nov. 16, 2013, which is herein incorporated by reference in its entirety.

FIELD

Embodiments of the present disclosure generally relate to methods for etching cobalt metal using fluorine radicals.

BACKGROUND

Cobalt is a promising fill material used, for example, as a PMOS fill material in a metal gate, a contact fill, and as a fill material for interconnects. However, the inventors have observed that the deposition of cobalt material onto a substrate results in cobalt residue forming onto process chamber components (such as a process kit that surrounds the substrate). For example, typically, cobalt deposition is performed on several substrates, followed by cooling down and venting of the process chamber. After the process chamber has been cooled and vented, process kit parts having cobalt residue are removed and replaced. After replacement with clean process kit parts, the chamber can be readied for further processing. However, the foregoing sequence of events results in significant down time for the process chamber.

Accordingly, the inventors have developed improved techniques for etching cobalt metal using fluorine radicals.

SUMMARY

Embodiments of methods for etching cobalt metal using fluorine radicals are provided herein. In some embodiments, a method of etching a cobalt layer in a substrate processing chamber includes: forming a plasma from a process gas comprising a fluorine-containing gas; and exposing the cobalt layer to fluorine radicals from the plasma while maintaining the cobalt layer at a temperature of about 50 to about 500 degrees Celsius to etch the cobalt layer.

In some embodiments, a method of cleaning a substrate processing chamber includes: (a) depositing a cobalt layer atop a substrate, wherein a cobalt residue from the deposition process is formed atop one or more components of the substrate processing chamber; (b) removing the substrate from the process chamber; (c) forming a plasma from a process gas comprising a fluorine-containing gas; and (d) exposing the cobalt residue to fluorine radicals from the plasma at a temperature of about 50 to about 500 degrees Celsius to etch the cobalt residue.

In some embodiments, a method of etching a cobalt layer in a substrate processing chamber includes: forming a plasma from a process gas comprising a fluorine-containing gas and one or more of oxygen gas ($O_2$), nitrous oxide ($N_2O$), or an inert gas, wherein the plasma is one of a capacitively coupled plasma or an inductively coupled plasma; and exposing the cobalt layer to fluorine radicals from the plasma while maintaining the cobalt layer at a temperature of about 50 to about 500 degrees Celsius to etch the cobalt layer, wherein the cobalt layer is disposed atop at least one of a surface of one or more components of the substrate processing chamber or is disposed atop a substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
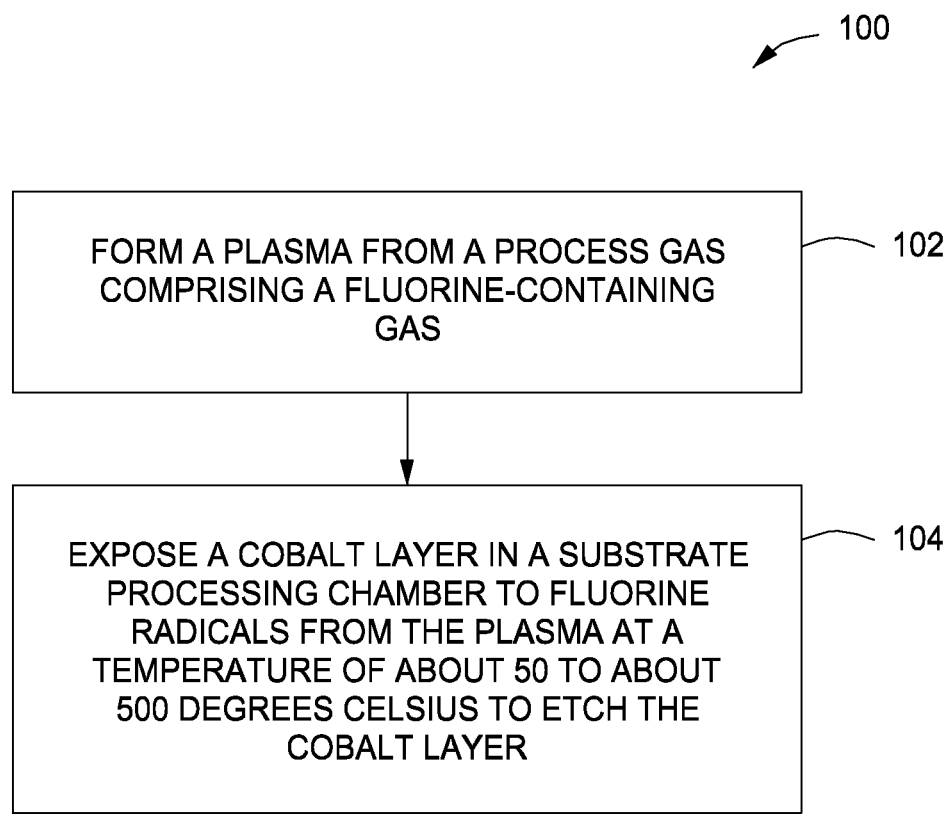
FIG. 1 depicts a flow chart of a method for etching a cobalt layer in a substrate processing chamber in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for etching cobalt metal are provided herein. Embodiments of the inventive methods can advantageously be utilized to etch cobalt material that is deposited onto a substrate, such as a semiconductor wafer, for example in the formation of metal interconnects. In addition, embodiments of the inventive methods can advantageously be used in situ to etch cobalt residue formed on process chamber components advantageously reducing down time associated with removing process chamber components from the process chamber for cleaning or replacement.

FIG. 1 depicts a flow chart of a method 100 of etching a cobalt layer in a substrate processing chamber in accordance with some embodiments of the present disclosure.

Figure 2A:
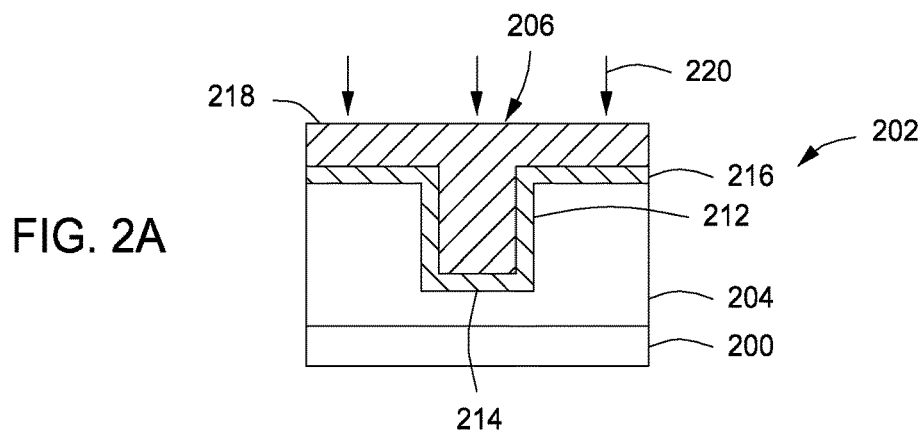
FIGS. 2A-2B depicts the stages of etching a cobalt layer disposed on a substrate in accordance with some embodiments of the present disclosure.
Figure 2B:
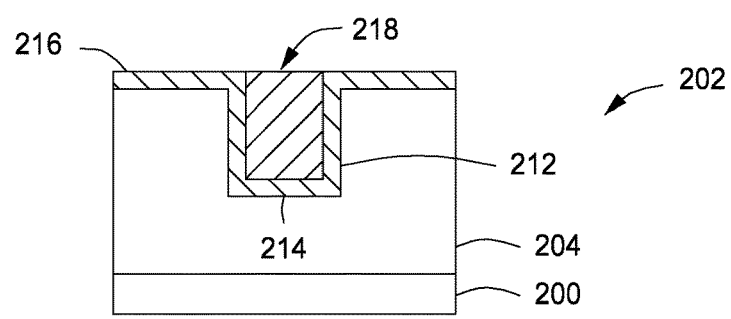

In some embodiments, as depicted in FIGS. 2A-2B, the cobalt layer may be deposited atop a substrate. The substrate 200 shown in FIG. 2A includes a semiconductor device structure 202 (e.g., such as a gate structure or other structures configured to form a contact structure) formed on the substrate 200. In some embodiments, the particular semiconductor device structure 202 may be used in three-dimensional (3-D) flash memory applications, DRAM applications, or other suitable applications with high aspect ratio or other odd geometries. The substrate 200 may comprise one or more of silicon (Si), silicon oxide ($SiO_2$), or the like.

In some embodiments, a silicon containing layer 204 is formed on the substrate 200 having openings 206 formed therein. In some embodiments, the opening may have a high aspect ratio, such as aspect ratios greater than 10:1, for example about greater than 20:1. The opening 206 (which may be a contact opening, contact via, contact trench, contact channel or the like) is formed in the semiconductor device structure 202 and have sidewalls 212 and a bottom 214 which forms an open channel to expose the underlying silicon containing layer 204. The silicon containing layer 204 may include any suitable layers such as a single silicon layer or a multiple layer film stack having at least one silicon containing layer formed therein. In the embodiment wherein the silicon containing layer 204 is in the form of a single layer, the silicon containing layer 204 may be a silicon oxide layer, an oxide layer, a silicon nitride layer, a nitride layer, a silicon oxynitride layer, a titanium nitride layer, a polysilicon layer, a microcrystalline silicon layer, a monocrystalline silicon, a doped polysilicon layer, a doped microcrystalline silicon layer, or a doped monocrystalline silicon.

In some embodiments, the substrate 200 may include additional layers of materials formed thereon. For example, in some embodiments, a barrier layer deposition process may be performed to deposit a barrier layer 216 on the substrate. The barrier layer 216 generally prevents diffusion of the contact metal layer to the junction material on the substrate, typically a silicon or silicon germanium compound. The barrier layer 216 generally contains a metal or a metal nitride material, such as titanium (Ti), titanium nitride (TiN), alloys thereof, or combinations thereof.

In such embodiments, the cobalt layer 218 may be deposited using any suitable metal-deposition process, such as a physical vapor deposition process or a chemical vapor deposition process. In some embodiments, the cobalt layer 218 fills the opening 206. Typically, the etching of a cobalt layer is performed via a wet chemical etch using acid based etchants. However, a wet chemical etching process is challenging for high aspect ratio features, common in three-dimensional transistor devices, due to pattern collapse resulting from surface tension and capillary forces. Furthermore, wet chemical etching processes are typically isotropic, resulting in the undesired etching of feature sidewalls.

Figure 3A:
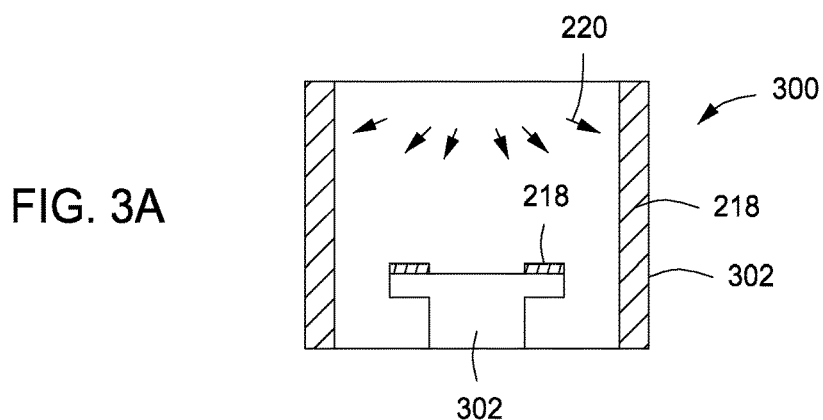
FIGS. 3A-3B depicts the stages of etching cobalt residue from one or more components of a process chamber in accordance with some embodiments of the present disclosure.
Figure 3B:
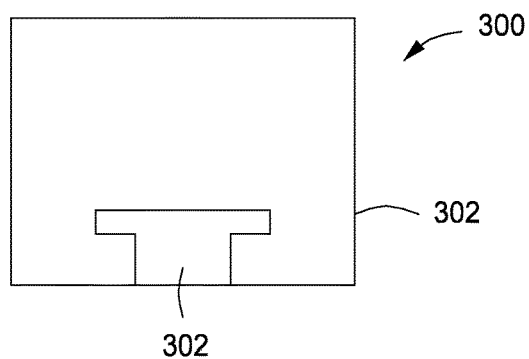

In some embodiments, as depicted in FIG. 3A-3B, the cobalt layer 218 may be deposited atop one or more process chamber components 302 of a substrate process chamber 300. Typically the deposition of cobalt onto semiconductor wafers via a PVD or CVD process results in a layer of cobalt residue adhering to the surfaces of various process chamber components 302 such as the chamber walls, a chamber lid, a substrate support, deposition rings surrounding the substrate, chamber liners, a showerhead, or the like. The cobalt residue can flake off the surfaces of the process chamber components 302 resulting in contamination during semiconductor wafer processing. As a result, process chamber components 302 having cobalt residue are typically cleaned or replaced with clean components, resulting in significant down-time for a substrate process chamber 300.

The method 100 is described below with respect to the stages of etching a cobalt layer disposed on a substrate in a substrate processing chamber as depicted in FIGS. 2A-2C or etching a cobalt layer disposed on one or more components of a substrate processing chamber as depicted in FIG. 3A-3B. The method 100 begins at 102 by forming a plasma from a process gas comprising a fluorine-containing gas. In some embodiments, the fluorine containing gas is one of fluorine gas ($F_2$), nitrogen trifluoride ($NF_3$), a fluorocarbon ($C_xF_y$), or tungsten hexafluoride ($WF_6$). In some embodiments, the process gas further comprises one or more of oxygen gas ($O_2$), nitrous oxide ($N_2O$), or an inert gas (e.g. argon, helium, or the like) which can improve the etch rate of the cobalt material. In some embodiments, the ratio of fluorine containing gas to the one or more of oxygen gas ($O_2$), nitrous oxide ($N_2O$), or an inert gas is about 1:10 to about 10:1. In some embodiments, the flow rate of the fluorine containing gas is about 200 sccm to about 2,000 sccm. The inventors have observed that the flow rate of the fluorine containing gas correlates with the etch rate of the cobalt layer. The inventors have observed that increasing the flow rate of the fluorine containing gas increases the cobalt etch rate in a linear fashion.

In some embodiments, the plasma is an inductively coupled plasma. In some embodiments, the plasma is a capacitively coupled plasma. The plasma may be formed in situ in the process chamber (e.g., a direct plasma), or the plasma may be formed outside of the process chamber (e.g., a remote plasma). The inventors have observed that a remote plasma provides a higher etch rate than a direct plasma because a remote plasma creates a higher number of radicals. In some embodiments, a process chamber may process multiple semiconductor wafers resulting in a thick cobalt residue forming on one or more components of the process chamber. As a result, the use of a remote plasma provides a high etch rate to quickly clean the chamber component (although a direct plasma may also be used). In some embodiments, etching a cobalt layer from a substrate 200 may be completed by etching a few angstroms. As a result, a direct plasma may be sufficient (although a remote plasma may still be used).

Next at 104, and as depicted in FIG. 2B and FIG. 3B, the cobalt layer 218 is exposed to fluorine radicals 220 from the plasma. In some embodiments, the cobalt layer 218 is maintained at a temperature of about 50 to about 500 degrees Celsius at least during the exposure to the fluorine radicals 220 from the plasma. In some embodiments, the cobalt layer 218 is maintained at a temperature of about 50 to about 250 degrees Celsius, or about 50 to about 300 degrees Celsius, while being exposed to the fluorine radicals 220. In some embodiments, the cobalt layer 218 is maintained at a temperature of greater than about 300 degrees Celsius (for example about 300 to about 500 degrees Celsius or about 400 to about 500 degrees Celsius) in order to form a volatile cobalt fluoride compound. In some embodiments, the etch rate of the cobalt layer is about 5 angstroms/second to about 50 angstroms/second.

The inventors have observed that the temperature at which the cobalt layer is exposed to the fluorine radicals impacts the etch rate of the cobalt layer. As a result, in some embodiments, the substrate 200 or the one or more process chamber components 302 of the substrate process chamber 300 may be heated to the desired temperature described above. For example, the inventors have observed that when using nitrogen trifluoride at a flow rate of about 250 sccm, and an argon flow rate of about 500 sccm at temperatures below about 300 degrees Celsius, the etch rate of cobalt on a semiconductor wafer fluctuates between 4 and 8 angstroms/second. However, the inventors have observed that, at the same flow rates of nitrogen trifluoride and argon but at temperatures greater than about 300 degrees Celsius, for example between about 350 and 400 degrees Celsius, the etch rate of cobalt on a semiconductor wafer increases rapidly, for example, to about 9 to 12 angstroms/second.

At temperatures below about 300 degrees Celsius, the fluorine radicals react with the cobalt layer to form the cobalt fluorides $CoF_2$ and $CoF_3$, which are solids having a melting point above about 1,000 degrees Celsius. At temperatures above about 300 degrees Celsius, the fluorine radicals react with the cobalt layer to form the volatile cobalt fluoride $CoF_4$ which is easily removed from the surface of the cobalt layer to provide a continuous fresh cobalt surface to react with the fluorine radicals. As a result, the etch rate at temperatures above about 300 degrees Celsius is higher than the etch rate at temperatures below about 300 degrees Celsius. Without wishing to be bound by theory, the inventors believe that when etching at temperatures below about 300 degrees Celsius, the etch rate drops as the etch process proceeds due to the formation of $CoF_2$ and $CoF_3$ on the surface of the cobalt layer and the inability of the fluorine radicals to penetrate the $CoF_2$ and $CoF_3$ on the surface to reach a fresh cobalt layer.

The inventors have further observed that a cobalt layer advantageously remains conductive after etching with fluorine radicals at temperatures above about 300 degrees Celsius, while a non-conductive cobalt film was obtained after etching at temperatures below about 300 degrees Celsius due to the formation of $CoF_2$ and $CoF_3$. In certain applications, maintaining the conductivity of the cobalt layer may be critical, for example, when etching a cobalt metal gate formed on a semiconductor wafer or other substrate. In other applications, maintaining the conductivity of the cobalt layer may not be critical and etching the cobalt at a temperature below about 300 degrees Celsius may be advantageous. For example, when etching cobalt from chamber components composed of a material having a melting point close to about 300 degrees Celsius, such as aluminum, an etch temperature below about 300 degrees Celsius, for example about 200 degrees Celsius to about 250 degrees Celsius, may be advantageous. In such embodiments, the flow rate of fluorine containing gas to the process chamber may be increased to increase the fluorine radical concentration within the process chamber.

The cobalt layer may be heated to and/or maintained at the desired temperature in any suitable manner. For example, in some embodiments, the cobalt layer may be heated by the plasma. In some embodiments, the cobalt layer may be actively heated (or cooled) by flowing a heat transfer fluid through an underlying chamber component proximate the cobalt layer. For example, a heat transfer fluid may be provided to channels disposed in the substrate support to heat or cool a cobalt layer disposed on a substrate, or on the substrate support or a deposition ring disposed on the substrate support. Alternatively or in combination, a heat transfer fluid may be provided to channels disposed in chamber walls, a chamber liner, or in the chamber lid. In some embodiments, a heat source such as a resistive heater may be provided in one or more of a substrate support, a deposition ring, a chamber liner, a chamber wall, a chamber lid, or the like. In some embodiments, a heat source such as an infrared (IR) lamp or other light energy source may be provided and positioned to heat a particular component of the process chamber such as the substrate support, deposition ring, chamber liner, chamber walls, and/or the chamber lid. Any one or more of the above heating and/or cooling mechanisms may be combined to heat, cool, or maintain the cobalt layer at the desired temperature.

After the cobalt layer is etched, the method 100 generally ends. In embodiments where the substrate is a semiconductor wafer the wafer may proceed for further processing, for example subsequent processes such as deposition, etch, annealing, or the like may be performed to fabricate a finished device. In embodiments where the cobalt is etched from chamber components, the method may be repeated as desired to maintain chamber cleanliness at a desired level, such as repeating after cobalt deposition on each substrate, after a batch of substrates, or after any number of substrates or at any time that a chamber clean is determined or believed to be necessary or desired.

Figure 4:
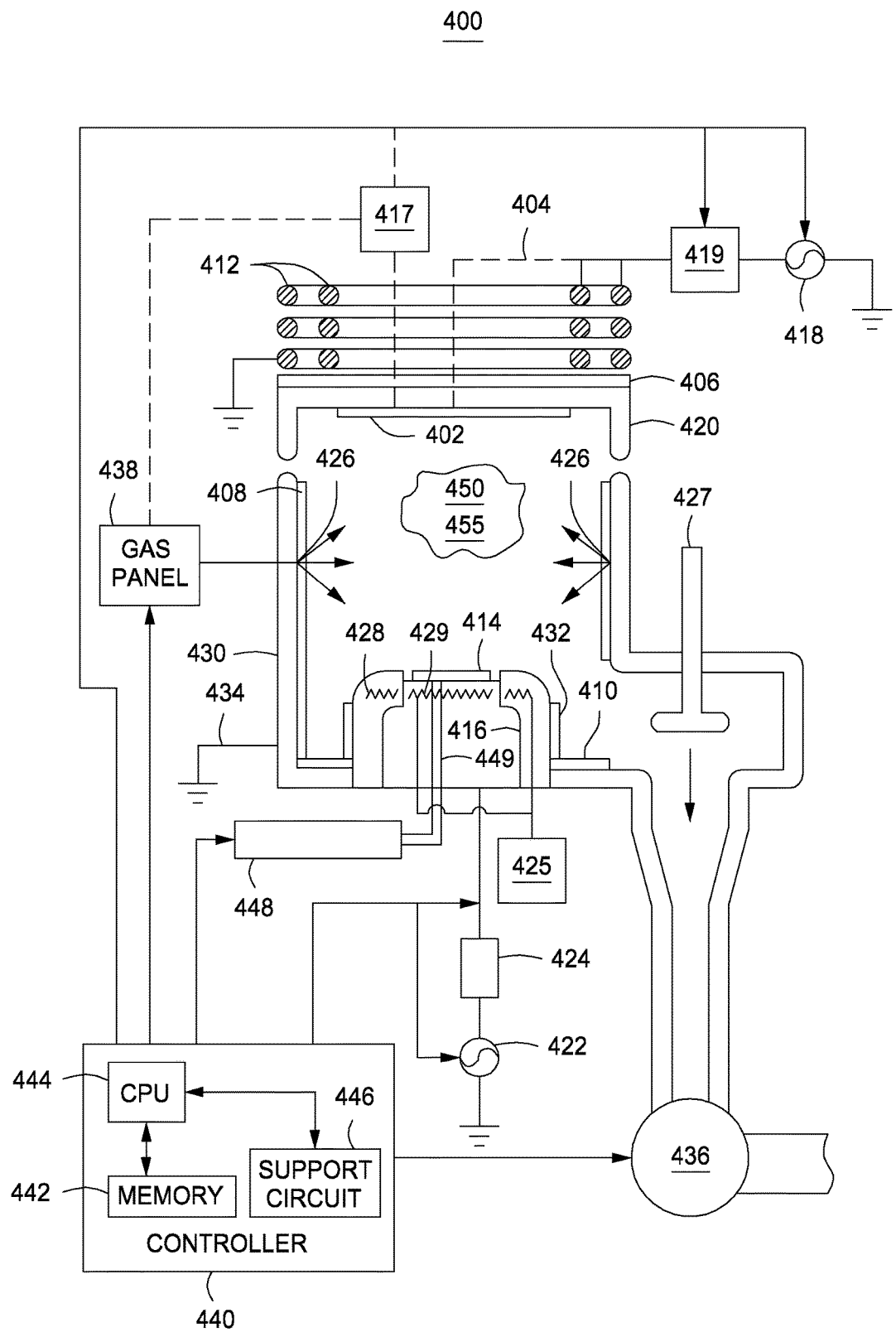
FIG. 4 depicts a process chamber suitable for performing a method of processing a substrate disposed in a substrate processing chamber in accordance with some embodiments of the present disclosure.

FIG. 4 depicts a schematic diagram of an illustrative process chamber 400 of the kind that may be used to practice embodiments of the disclosure as discussed herein. The process chamber 400 may be utilized alone or, more typically, as a processing module of an integrated semiconductor substrate processing system, or cluster tool, such as a ENDURA®, CENTURA®, or PRODUCER® integrated semiconductor substrate processing system, available from Applied Materials, Inc. of Santa Clara, Calif. In some embodiments, the process chamber 400 may be an etch reactor, for example including but not limited to any of the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other etch reactors and/or cluster tools may suitably be used as well. In some embodiments, the process chamber 400 may be a deposition chamber, such as a chemical vapor deposition (CVD) chamber suitable for depositing cobalt on a substrate. For example, embodiments of the present disclosure relating to cleaning chamber components may be used on suitably configured cobalt CVD chambers. Suitable cobalt deposition process chambers include, but are not limited to, certain single wafer chambers on the ENDURA® platform and twin wafer chambers on the PRODUCER® platform, also available from Applied Materials, Inc. In-situ chamber clean in accordance with the methods described herein can be utilized on either of these chambers/platforms, as well as other chambers and platforms.

The process chamber 400 includes a substrate support 416 (cathode) within a conductive body (wall 430), and a controller 440. Optionally, one or more liners may be provided to line the walls, floor, and/or ceiling of the process chamber 400. As depicted in FIG. 4, a liner 408 is shown along the side wall of the process chamber 400, along with a liner 410 along the floor, and a liner 432 along the sides of the substrate support 416.

The process chamber 400 may be supplied with a substantially flat ceiling 420. Alternatively, the process chamber 400 may have other types of ceilings, e.g., a dome-shaped ceiling. In some embodiments, a heat source 406 may be disposed in or adjacent to the ceiling 420. The heat source may comprise one or more of resistive heaters, infrared lamps or other sources of infrared heat energy, a fluid heat transfer medium provided to heat transfer fluid flow channels formed in or adjacent to the ceiling 420.

In embodiments where an inductively coupled direct plasma is to be formed, the ceiling 420 may be dielectric. In such embodiments, an antenna comprising at least one inductive coil element 412 is disposed above the ceiling 420 (two co-axial inductive coil elements 412 are shown). The inductive coil element 412 is coupled to a plasma power source 418 through a first matching network 419.

Alternatively, in some embodiments the process chamber 400 may utilize capacitively coupled RF power provided by coupling the plasma power source 418 to an upper electrode 402 proximate an upper portion of the process chamber 400 (as shown by dashed lines 404). For example, the upper electrode 402 may be a conductor formed, at least in part, by one or more of the ceiling 420, a showerhead or other component disposed proximate the ceiling (as shown), or the like, fabricated at least in part from a suitable conductive material.

Alternatively or in combination, a remote plasma source 417 may be provided to provide species from a remotely formed plasma to the process chamber 400.

The plasma power source 418 typically is capable of producing up to 3000 W at a tunable frequency in a range from about 50 KHz to about 13.56 MHz. The plasma power source 418 may be operable in a continuous wave (CW) or pulsed mode. When in pulse mode, the plasma power source 418 may be pulsed at a pulse frequency of up to about 100 KHz, or in some embodiments, between about 100 Hz to about 100 KHz. The plasma power source 418 may be operated at a duty cycle (e.g., the percentage of on time during the total of on time and off time in a given cycle) of between about 10% and about 90%.

The substrate support 416 is coupled, through a second matching network 424, to a biasing power source 422. The biasing power source 422 generally is capable of producing up to 1500 W at a frequency of approximately 13.56 MHz. The biasing power may be either continuous or pulsed power. In other embodiments, the biasing power source 422 may be a DC or pulsed DC source. The biasing power source 422 may be operable in a continuous wave (CW) or pulsed mode. When in pulse mode, the biasing power source 422 may be pulsed at a pulse frequency of up to about 100 kHz, or in some embodiments, between about 100 Hz to about 100 kHz. The biasing power source 422 may be operated at a duty cycle (e.g., the percentage of on time during the total of on time and off time in a given cycle) of between about 10% and about 90%.

A controller 440 comprises a central processing unit (CPU) 444, a memory 442, and support circuits 446 for the CPU 444 and facilitates control of the components of the process chamber 400 and, as such, of the etch process, as discussed herein in further detail.

In operation, a substrate 414 is placed on the substrate support 416 and process gases are supplied from a gas panel 438 through entry ports 426 and form a gaseous mixture 450. The gaseous mixture 450 is ignited into a plasma 455 in the process chamber 400 by applying power from the plasma power source 418 and biasing power source 422 to the inductive coil element 412 (or the upper electrode 402) and the cathode (substrate support 416), respectively. In some embodiments, the gaseous mixture 450 is ignited into a plasma in the remote plasma source 417 coupled to the process chamber 400. The pressure within the interior of the process chamber 400 is controlled using a throttle valve 427 and a vacuum pump 436. Typically, the wall 430 is coupled to an electrical ground 434. The temperature of the wall 430 is controlled using liquid-containing conduits (not shown) that run through the wall 430.

In some embodiments, the temperature of the substrate 414 may be controlled by stabilizing a temperature of the substrate support 416. In some embodiments, an inert gas, such as helium or argon, from a gas source 448 is provided via a gas conduit 449 to channels (not shown) formed in the pedestal surface under the substrate 414. The inert gas is used to facilitate heat transfer between the substrate support 416 and the substrate 414. During processing, the substrate support 416 may be heated to a desired temperature by one or more resistive heaters (two resistive heaters 428, 429 shown) disposed within the pedestal and coupled to a power supply 425. The inert gas provided between the substrate support 416 and the substrate 414 facilitates more uniform heating of the substrate 414. Using such thermal control, the substrate 414 (or the substrate support or components disposed on the substrate support) may be maintained at a temperature of between about 0 to about 650 degrees Celsius.

Other etch chambers may be used to practice the disclosure, including chambers with remote plasma sources, electron cyclotron resonance (ECR) plasma chambers, and the like.

To facilitate control of the process chamber 400 as described above, the controller 440 may be one of any form of general-purpose computer processor that can be used in an industrial setting for controlling various chambers and sub-processors. The memory 442, or computer-readable medium, of the CPU 444 may be one or more of readily available memory such as random access memory (RAM), read only memory (ROM), floppy disk, hard disk, or any other form of digital storage, local or remote. The support circuits 446 are coupled to the CPU 444 for supporting the processor in a conventional manner. These circuits include cache, power supplies, clock circuits, input/output circuitry and subsystems, and the like. The inventive method described herein is generally stored in the memory 442 as a software routine. The software routine may also be stored and/or executed by a second CPU (not shown) that is remotely located from the hardware being controlled by the CPU 444.

While the foregoing is directed to embodiments of the present disclosure, other and further embodiments of the disclosure may be devised without departing from the basic scope thereof.

The invention claimed is:

1. A method of etching a cobalt layer in a substrate processing chamber, comprising:
   forming a plasma from a process gas comprising a fluorine-containing gas; and
   exposing the cobalt layer, the cobalt layer comprising only cobalt, to fluorine radicals from the plasma while maintaining the cobalt layer at a temperature of about 50 to about 250 degrees Celsius to etch the cobalt layer at a rate of about 4-8 angstroms/second.

2. The method of claim 1, wherein the process gas further comprises one or more of oxygen gas ($O_2$), nitrous oxide ($N_2O$), or an inert gas.

3. The method of claim 1, wherein the process gas consists of the fluorine-containing gas, or the fluorine-containing gas and one or more of oxygen gas ($O_2$), nitrous oxide ($N_2O$), or an inert gas.

4. The method of claim 1, wherein the cobalt layer is disposed atop a surface of one or more components of the substrate processing chamber.

5. The method of claim 1, wherein the plasma is a capacitively coupled plasma.

6. The method of claim 1, wherein the plasma is an inductively coupled plasma.

7. The method of claim 1, wherein forming the plasma further comprises providing the process gas at a flow rate of about 200 sccm to about 2,000 sccm.

8. The method of claim 1, wherein the fluorine-containing gas is one of fluorine gas ($F_2$), nitrogen trifluoride ($NF_3$), a fluorocarbon ($C_xF_y$), or tungsten hexafluoride ($WF_6$).

9. A method of etching a cobalt layer in a substrate processing chamber, comprising:
   forming a plasma from a process gas comprising a fluorine-containing gas; and
   exposing the cobalt layer, the cobalt layer comprising only cobalt, to fluorine radicals from the plasma while maintaining the cobalt layer at a temperature of greater than 400 degrees Celsius to about 500 degrees Celsius to form a volatile cobalt fluoride compound to etch the cobalt layer.

10. The method of claim 9, wherein the volatile cobalt fluoride compound is $CoF_4$.

11. The method of claim 9, wherein the cobalt layer is disposed atop a surface of one or more components of the substrate processing chamber.

12. The method of claim 9, wherein the plasma is a capacitively coupled plasma or an inductively coupled plasma.

13. The method of claim 9, wherein the plasma is an inductively coupled plasma.

14. The method of claim 9, wherein forming the plasma further comprises providing the process gas at a flow rate of about 200 sccm to about 2,000 sccm.

15. The method of claim 9, wherein the fluorine-containing gas is one of fluorine gas ($F_2$), nitrogen trifluoride ($NF_3$), a fluorocarbon ($C_xF_y$), or tungsten hexafluoride ($WF_6$).

16. A method of etching a cobalt layer in a substrate processing chamber, comprising:

forming a plasma from a process gas comprising a fluorine-containing gas and one or more of oxygen gas ($O_2$), nitrous oxide ($N_2O$), or an inert gas, wherein the plasma is one of a capacitively coupled plasma or an inductively coupled plasma, wherein the ratio of the fluorine-containing gas to the one or more of oxygen gas ($O_2$), nitrous oxide ($N_2O$), or an inert gas is about 1:10 to about 10:1; and exposing the cobalt layer, the cobalt layer comprising only cobalt, to fluorine radicals from the plasma while maintaining the cobalt layer at a temperature of greater than 400 to about 500 degrees Celsius to etch the cobalt layer, wherein the cobalt layer is disposed atop at least one of a surface of one or more components of the substrate processing chamber or is disposed atop a substrate.

* * * * *